United States Patent [19]

Wentworth et al.

[11] Patent Number: 4,818,821

[45] Date of Patent: Apr. 4, 1989

[54] BRAZED LEADED PACKAGE

[75] Inventors: Robert M. Wentworth, Phoenix; Brian Webb, Mesa, both of Ariz.

[73] Assignee: Motorola Inc., Schaumburg, Ill.

[21] Appl. No.: 175,450

[22] Filed: Mar. 30, 1988

[51] Int. Cl.[4] ............................................. H01L 23/10
[52] U.S. Cl. ...................................... 174/52.4; 357/74
[58] Field of Search ................ 174/52 FP; 357/70, 74

[56] References Cited

U.S. PATENT DOCUMENTS

| 4,038,488 | 7/1977 | Lin | 174/52 FP |
| 4,331,258 | 5/1982 | Geschwind | 174/52 FP X |
| 4,633,573 | 1/1987 | Scherer | 174/52 FP X |

OTHER PUBLICATIONS

TRW AD, Electronic Business, p. 31 Mar. 1, 1988.

Primary Examiner—Arthur T. Grimley
Assistant Examiner—David A. Tone
Attorney, Agent, or Firm—Joe E. Barbee

[57] ABSTRACT

A brazed leaded package is provided having buried brazed areas thereby eliminating the need of subsequent protective plating of the brazed areas. The package has a heat conductive support which supports a plurality of leads. The distal end of the leads terminate on the top of the heat conductive support in a braze pad to which are brazed formed leads for providing interface connection to a semiconductor integrated circuit contained within the package. The package can be sealed by using a solid ceramic cover having a glazed glass on its bottom side which is heated up to reflow and provide the seal.

4 Claims, 1 Drawing Sheet

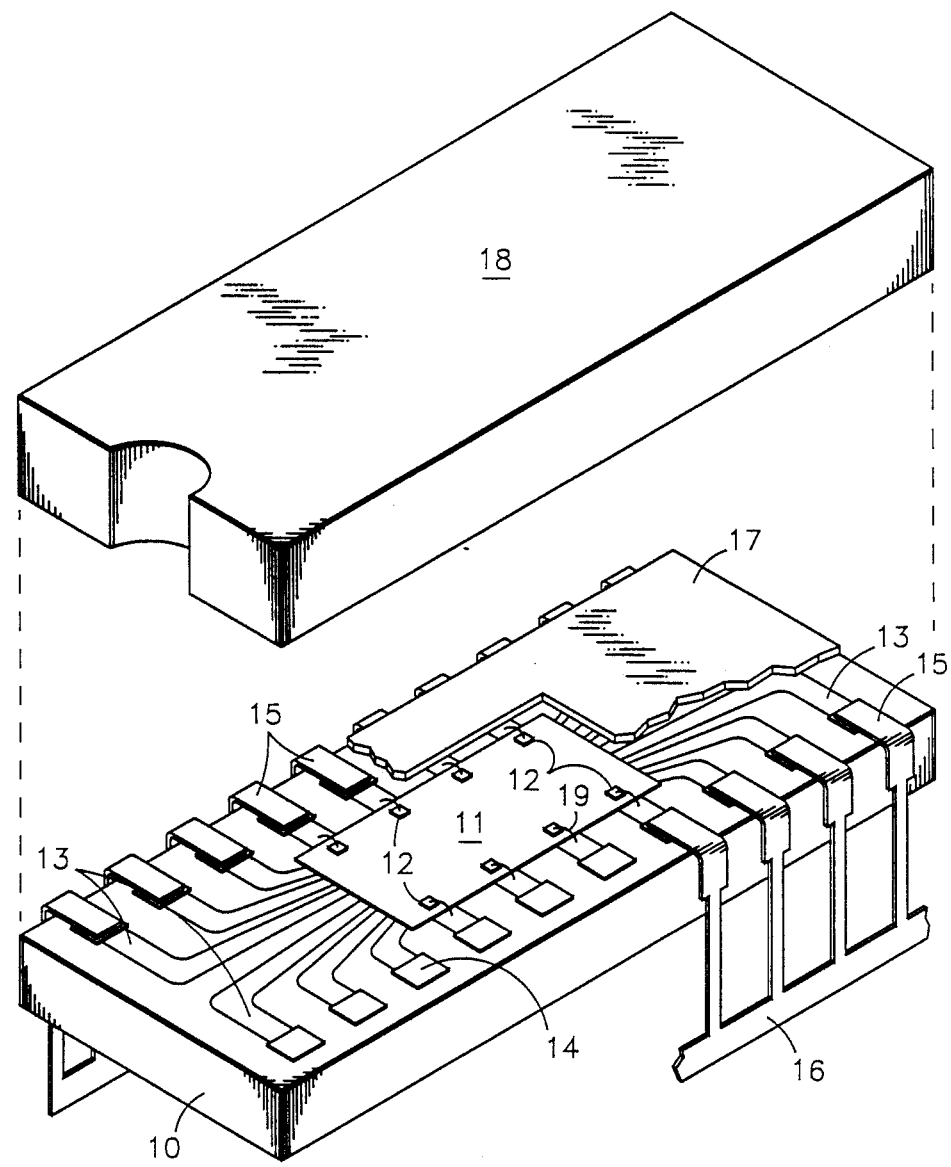

BRAZED LEADED PACKAGE

BACKGROUND OF THE INVENTION

This invention relates, in general, to semiconductor packages, and more particularly, to a semiconductor integrated circuit package having protected brazed leads.

Brazed leads have been used in the past, particularly in dual-in-line packages. These packages either had the brazed connection on the side of the package or the bottom of the package. The leads were typically brazed to the braze pads using a copper/silver (cusil) braze material. Some type of plating was required in order to cover the brazed area and protect it from corrosion. A typical example of such a package is a ceramic side brazed dual-in-line package (DIP).

The protective plating used to cover the brazed area was generally gold or nickel. More recently, nickel was the preferred plating material because of the high cost of gold. However, it would be desirable to eliminate the plating which would result yet in further reduced costs.

Accordingly, it is an object of the present invention to provide an improved brazed leaded package having buried brazed areas.

Another object of the present invention is to provide a buried brazed leaded package which eliminates the requirement of gold or nickel plating.

SUMMARY OF THE INVENTION

The above and other objects and advantages of the present invention are achieved through the use of a brazed leaded package having top side braze pads. Formed leads are attached to the top side braze pads. A layer of sealing glass is then applied and glazed over the top side braze pads. A cover having a glazed sealing glass on its bottom is then mated to the package and the entire assembly is heated. The heat causes the sealing glass to reflow thereby sealing the cover to the package and protecting the brazed area from corrosion. This eliminates a requirement of having to plate gold or nickel over the brazed area to form the protection.

BRIEF DESCRIPTION OF THE DRAWINGS

The single figure illustrates an exploded view of an embodiment of the present invention.

DETAILED DESCRIPTION OF THE DRAWING

The single figure is an exploded view of a brazed leaded package which illustrates an embodiment of the present invention. The brazed leaded package illustrated is a dual-in-line package. The package includes a support member 10 which can be made from aluminum oxide, or the like, and serves as a heat sink for semiconductor integrated circuit 11. In a preferred embodiment, support 10 is an electrically insulating but thermally conductive support. Heat conductive support 10 may contain a recess or well for receiving integrated circuit 11. In cases where a back contact is desired to be made to integrated circuit 11 heat conductive support 10 is preferably made in two layers. The bottom layer will be a flat layer and will contain on its top surface a metallized portion for making contact to the back side of integrated circuit 11. In the two layer configuration, the top layer of support 10 has a window in it to accommodate integrated circuit 11 or additional interconnect circuitry.

The top side of support 10 supports a plurality of leads 13 which terminate in top braze pads 14. Plurality of leads 13 can be a portion of a lead frame resting on heat conductive support 10 or leads 13 can be made from a refractory metal such as titanium-tungsten, or the like. By terminating leads 13 on the top side of support 10, brazed pads 14 will be protectively covered up when cover 18 is in place. The previous brazed leaded packages had brazed pads located along the lateral sides of the heat conductive support. This resulted in brazed areas being exposed which then required a protective plating to protect the brazed areas from any corrosive elements.

Integrated circuit 11 contains a plurality of contact pads 12. As those persons skilled in the art will understand, typically integrated circuit 11 will have more contact pads 12 than those illustrated in the single figure and most likely will have close to the same number of contact pads 12 as there are leads 13. Contact pads 12 are electrically connected to leads 13 by thin wires 19. Formed leads 15 are brazed to braze pads or terminations 14 typically by a copper/silver (cusil) braze material. Formed leads 15 extend over the lateral sides of support 10, and as illustrated are bent downwards. The distal ends of formed leads 15 are interconnected by tie bar 16. Those persons skilled in the art will recognize that tie bar 16 is removed before final assembly electrical tests are performed on the final assembly.

A glazed sealing glass 17 is placed on the top side of support 10 and covers the majority of the portions of leads 13 and the brazed area including braze pads 14. As indicated in the partially single figure, glazed sealing glass 17 is partially removed to provide an exposed view of leads 13 and braze pads 14 only for a better understanding of the invention. It should also be noted that a portion of formed leads 15 is not shown in the single figure in order to more clearly illustrate top braze pads 14. Glazed sealing glass 17 can be a soft glass which is screened on and then fired in a furnace. The portion of leads 13 which is not covered by sealing glass 17 is the portion immediately surrounding integrated circuit 11. This allows for connection of wires 19 to leads 13.

Cover 18, which can be a pressed ceramic cover, has a recessed portion on its bottom side (not shown) to accommodate the top side of integrated circuit 16 and bonding wires 19. Also, the bottom portion of cover 18, which is not recessed, will also have a layer of glazed sealing glass such as glass 17. Cover 18 is then placed on the top of the bottom portion of the assembly and fired in a furnace to cause the sealing glasses to reflow and form a seal thereby sealing the interior portion of the package and bonding cover 18 to support 10. This results in the brazed areas, which join formed leads 15 to braze pads 14, to be entirely hermetically sealed thereby protecting the brazed areas from any corrosive influences. This sealed enclosure of the brazed areas eliminates a requirement for any protective gold or nickel plating over the brazed areas.

By now it should be appreciated that there has been provided a new and improved brazed leaded package which results in buried brazed leads eliminating the need for a protective pre-plate plating. Therefore formed leads 15 can be plateless alloyed leads. Formed leads 15 will require tin plating or tinning if they are to be soldered into a circuit. The present invention results in a more cost effective package since it uses lower cost formed leads and does not require subsequent protective plating over the brazed areas. Also eliminated is the problem of missing plating and failure to pass a solderability test due to de-wetting which are usually not encountered until the package is completely assembled. In the present invention the braze area is placed on the top instead of the sides or bottom of the package, and thus the brazed area is buried under a layer of sealing glass. After die attachment, wire bond, and placement of top cover 18, the package is sealed using a frit seal instead of the standard solder seal.

We claim:

1. A brazed leaded semiconductor package having buried brazed junctions comprising:
   a heat conductive support having an area for receiving a semiconductor integrated circuit, and also having a top side and lateral sides; a plurality of interconnecting leads located on the top side of the heat conductive support and having termination pads on the top side; a semiconductor integrated circuit mounted in the area of the heat conductive support for receiving the semiconductor integrated circuit and being electrically connected to the plurality of interconnecting leads; a plurality of formed leads brazed to the termination pads and extending beyond the heat conductive support; and a cover placed on the top side and sealed to the heat conductive support to provide a hermetic seal of the termination pads.

2. The brazed leaded semiconductor package of claim 1 wherein the formed leads are bent downward along the lateral sides and the formed leads do not require a gold or nickel protective plating since the brazed portion is sealed.

3. The brazed leaded semiconductor package of claim 1 wherein the plurality of interconnecting leads are refractory metal leads.

4. The brazed leaded semiconductor package of claim 1 further including a layer of sealing glass which is glazed over the termination pads having the brazed leads to protect the brazed areas from corrosive environments.

* * * * *